United States Patent [19]

Shimamura et al.

[11] Patent Number: 4,602,351
[45] Date of Patent: Jul. 22, 1986

[54] DEVICE FOR READING AND WRITING IC-EXTERNAL STORAGE CARDS

[75] Inventors: Norio Shimamura; Taiji Sudo, both of Tokyo, Japan

[73] Assignee: Tokyo Tatsuno Co., Ltd., Tokyo, Japan

[21] Appl. No.: 623,736

[22] Filed: Jun. 22, 1984

[30] Foreign Application Priority Data

| Jul. 6, 1983 | [JP] | Japan | 58-122950 |
| Jul. 6, 1983 | [JP] | Japan | 58-122951 |
| Jul. 6, 1983 | [JP] | Japan | 58-122952 |
| Jul. 18, 1983 | [JP] | Japan | 58-130493 |
| Jul. 18, 1983 | [JP] | Japan | 58-130495 |
| Aug. 4, 1983 | [JP] | Japan | 58-142807 |

[51] Int. Cl.$^4$ .................. G11C 17/00; G06K 7/06
[52] U.S. Cl. ........................ 365/52; 235/441
[58] Field of Search .................. 365/52, 63; 235/441

[56] References Cited

U.S. PATENT DOCUMENTS 3,883,856  5/1975  Saito et al. ................. 365/105 X
3,988,721 10/1976  Frutiger ...................... 365/52 X Primary Examiner—Joseph A. Popek
Attorney, Agent, or Firm—Jordan and Hamburg

[57] ABSTRACT

A device to be coupled with a computer for reading and writing IC external storage in the form of a card having a plurality of contact points arranged on a portion of the card includes a first board having a main board and an additional board which are arranged to receive and hold the card therebetween and a second board hingedly connected to the first board so that the first board is pivotally movable between a first position herein the first board is engaged with the second board and a second position wherein the first board is opened with respect to the second board so that the storage card may freely be loaded on and removed from the first board. A block member provided with contact pins of the number and arrangement corresponding to that of the contact points is mounted on the second board via a coiled spring so as to normally maintain an extended position while being yieldingly movable from the extended position. The additional board has a window formed therein through which the contact pins on the block member pass so as to contact the contact points of the loaded storage card when the first board is brought into the first position.

8 Claims, 20 Drawing Figures

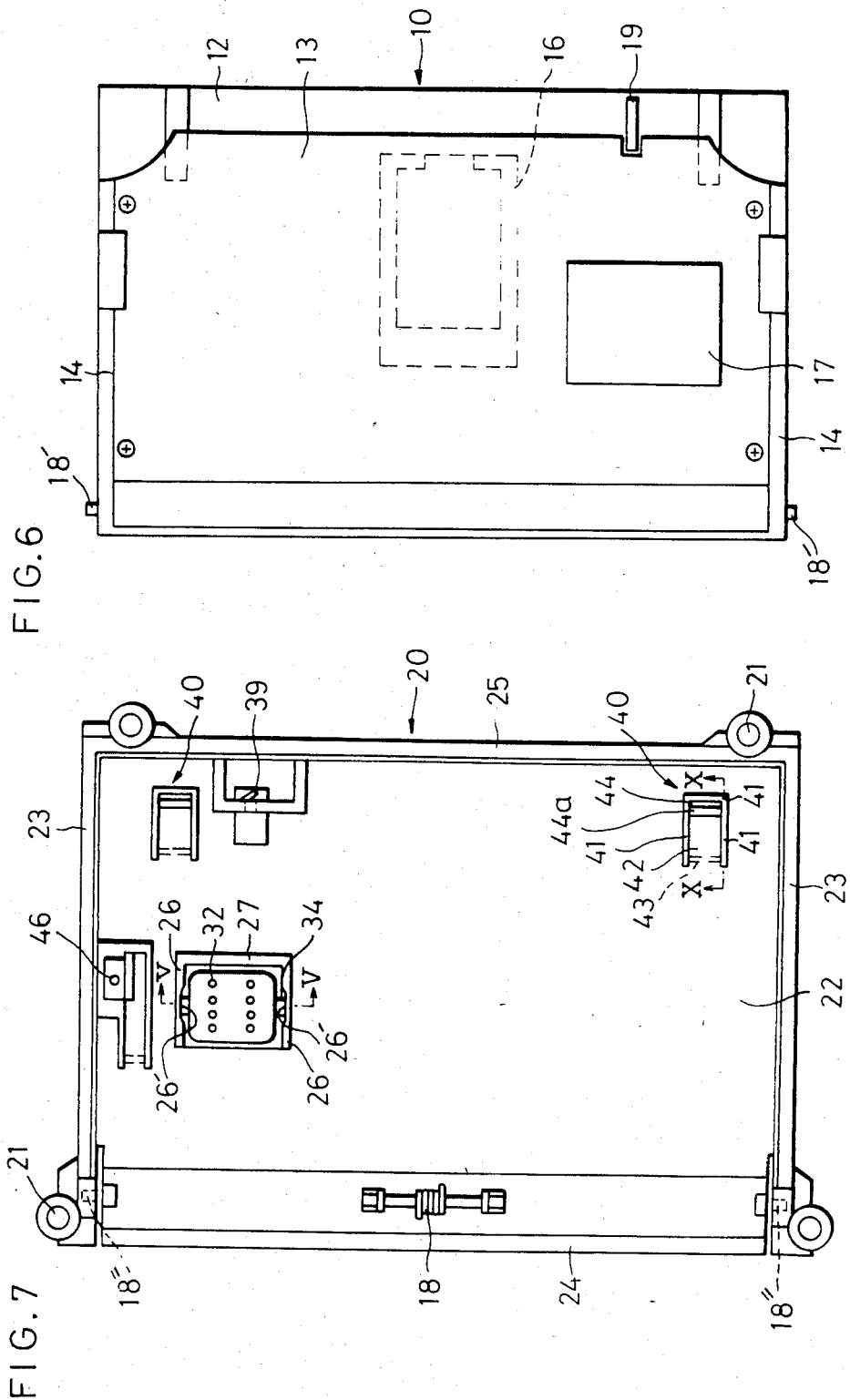

FIG.10A
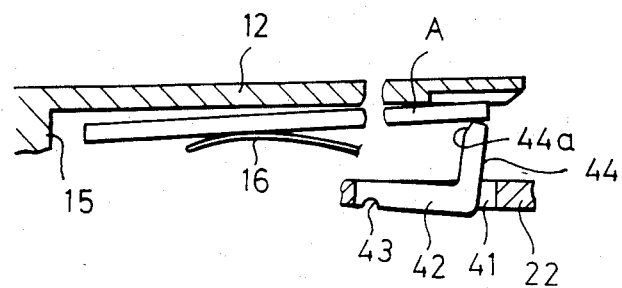
FIG.10B
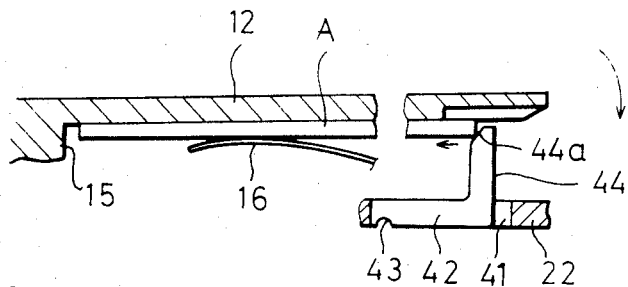
FIG.10C
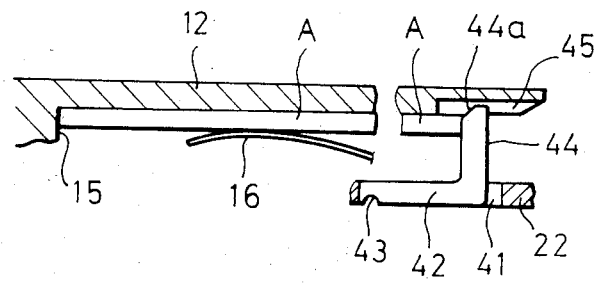
FIG.11A  FIG.11B  FIG.11C
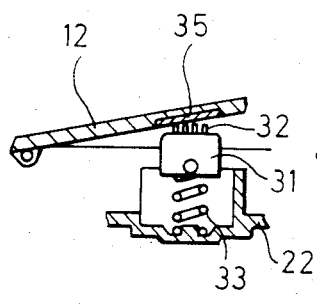 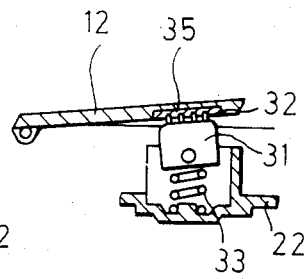 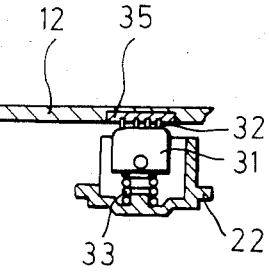

1

DEVICE FOR READING AND WRITING IC-EXTERNAL STORAGE CARDS

BACKGROUND OF THE INVENTION

This invention relates to a device to be coupled with a computer for reading and writing IC external storage in the form of a card of various thickness having a plurality of exposed contact points.

Recently the so-called IC card has widely been used as a credit card, identification card and for a like purpose instead of a magnetic card. Such IC card comprises a plate, generally made of plastic material, having at least an erasable and electrically reprogrammable ROM which is abbreviated as EPROM and a central processing unit which is often abbreviated as CPU, respectively embedded therein. A plurality of contact points respectively electrically connected with said elements are also embedded in said plastic plate so that the heads thereof are exposed to be flush with the card plate surface.

Such card is inserted into a recess of a corresponding thickness and size so as to be coupled with a computer for reading out stored information and writing in new information. The IC card is made as thin as possible so as to be conveniently carried by the concerned person in the person's pocket or the like. Thus, the card is often warped to prevent smooth insertion thereof into said recess and this causes a bad electrical connection. Furthermore, electrical contacts provided in such recess are often stained with dust and the like.

On the other hand, the so-called RAM pack has been used also as an external storage for the computer, above all for a very small or portable computer, and comprises a block having a random access memory and a battery for holding stored memory contained therein. Generally, the heads of a plurality of contact pins connected with said elements protrude out of said block so as to be coupled with a socket of the computer.

SUMMARY OF THE INVENTION

It is an object of this invention, according to one aspect of the invention, to provide a device to be coupled with a computer for reading and writing not only IC cards of various thicknesses and even if warped but also RAM packs made in a card plate form which is inevitably thicker than IC cards more or less due to a embedded battery which is bulky in comparison with said other elements and which is thereby operable to perform the concerned function and objectives far more effective.

Said object can be attained fundamentally by providing a device comprising a first board having a pocket for firmly holding external storage cards of various thicknesses as in an elastically biased position and a second board having a block member provided with contact pins so arranged as to be engaged with contact points of said external storage card when said two boards are in the engaged position.

In order to ensure more reliable engagement of said opposite contacts, said contact pin block member is mounted on said second board via a coiled spring so as to be yieldingly movable.

It is a still another object to provide such a device having a porous elastomer pad embedded in the inner surface of said first board so as to engage with said contact points for cleaning when said two boards are in the engaged position without holding any external storage plate therein, which is made possible by the arrangement as referred to above.

It is a further object of the invention according to another aspect thereof to provide a portable computer incorporated with said device so as to be compact and perform more effectively at the job site.

The other objects and advantages may be appreciated by studying the explanation set forth hereinafter with reference to the accompanying drawings.

BRIEF DESCRIPTION OF THE DRAWINGS

FIG. 6 is a bottom plan view of the first board, FIG. 7 is a top plan view of the second board, FIGS. 10A, 10B and 10C are sectional views taken along the line X—X in FIG. 7, FIGS. 11A, 11B and 11C are sectional views of a part of the first board where a porous elastomer pad is embedded and showing the contact pin block member and the engagement thereof.

DESCRIPTION OF THE PREFERRED EMBODIMENTS

Figure 1:
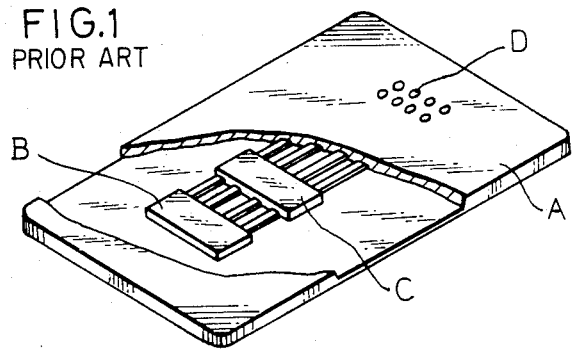
FIG. 1 is a perspective view of one of the typical IC cards to be applied to the device of the invention, partly cut away for showing the elements embedded therein.

In order to facilitate understanding of the invention, a typical IC card to be applied to the device of the invention is illustrated in FIG. 1, and comprises a card plate A generally made of plastic material comprising a non-volatile memory B and a central processing unit C respectively embedded therein. A plurality of contact points D, eight contact points namely clock, reset, I/0, timing, bias, electric source, non-contact and earth terminals in the illustrated card, are connected with said elements and are also embedded in the card plate A so that the free ends thereof are exposed on one side of the card to be flush with the surface thereof.

Figure 2:
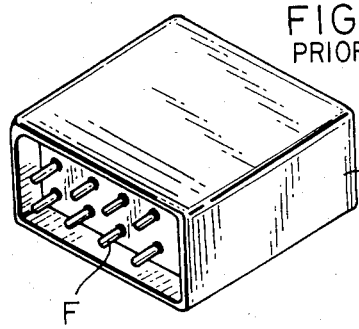
FIG. 2 is a perspective view of one of the typical RAM packs, FIG. 2' is a perspective view of the RAM pack made in a card plate form so as to be applicable to the device of the invention, partly cut away for showing the elements embedded therein.
Figure 2:
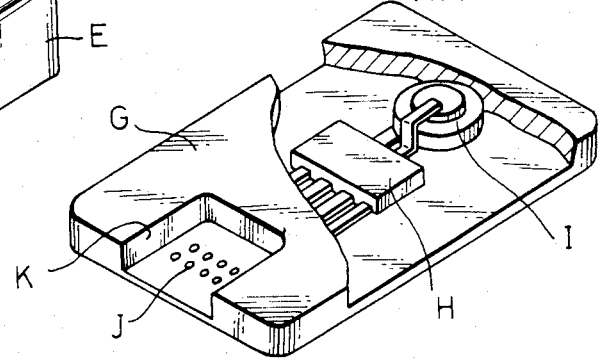

For the same purpose, a typical RAM pack usually used is illustrated in FIG. 2, and comprises a block E comprising a random access memory and a battery contained therein. The contact pins F, eight pins in the illustrated pack, protrude out of the casing E, and said pins F are connected with said elements. Such RAM pack in the form of a plug is coupled with the corresponding socket for the computer, usually a very small computer or portable computer for reading stored informations therefrom and writing new informations therein.

According to the invention, in order to utilize such different external storages to be applied to one and the same device to be coupled with a computer, a RAM pack in card plate form as shown in FIG. 2' is proposed, and comprises a plate G made of plastic material comprising a random access memory H and a battery I embedded therein. Eight contact points J connected with said elements are also embedded so that the free ends thereof are exposed on one side of said plate G to be flush with the surface thereof. The plate G is inevitably thicker than the IC card A mainly due to the bulky battery. Thus, it is not always necessary but it is preferable to form a cavity K at the area where contact points J are arranged so that the thickness of the plate G is made thin in said area to be substantially the same as that of the IC card A.

One embodiment of the device according to one aspect of the invention shall be explained with reference to FIGS. 3, 4A, 6 and 7.

A first board for holding the external storage card of various thickness is represented generally by 10, while a second board provided with a contact pin block member is reresented generally by 20. Said two boards are pivotally engaged by means of opposite protrusions 18', 18' of the board 10 and opposite grooves 18'', 18'' of the board 20 along a line L—L so as to be pivotally movable between the relatively closed position shown in FIG. 3 and the relatively open position shown in FIG. 4A.

The first board or lid 10 is preferably formed with a window 11 at a position where some letters or symbols given on the upper surface of the external storage card correctly loaded may be read therethrough so as to identify the sort of the external storage card and confirm whether or not it is correctly positioned. The second board or base body 20 is preferably provided with flanges 21 at the four corners for mounting the device to the computer.

Figure 3:
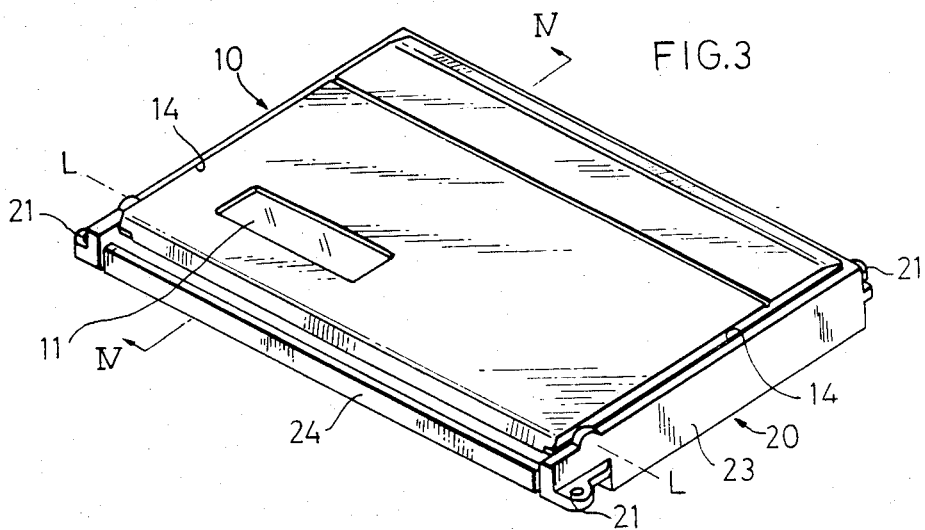
FIG. 3 is a perspective view of one embodiment of the invention.
Figure 4A:
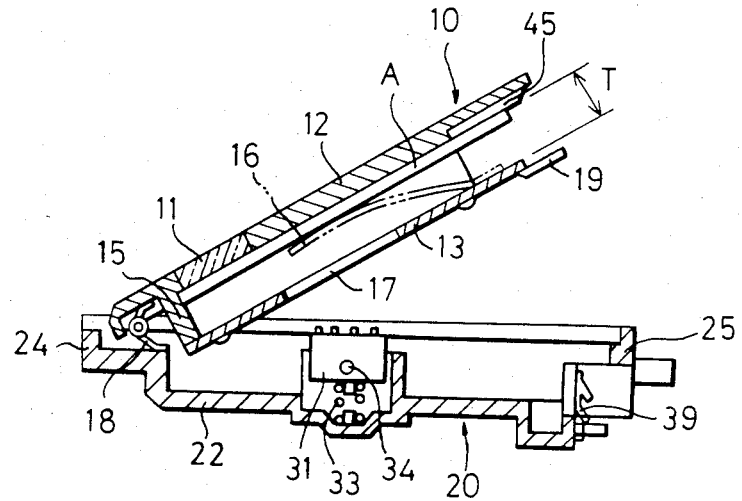
FIG. 4A is a sectional view taken along a line IV—IV in FIG. 3 but showing the first board for holding the external storage card as shown in FIGS. 1 and 2' in the open position relative to the second board provided with a contact pin block member.

As best shown in FIG. 4A, which is a sectional view taken along the line IV—IV in FIG. 3, the first board 10 comprises a main board 12, an additional board 13, a pair of side walls 14 (FIG. 3) and an end wall 15 to provide a pocket for loading the external storage card like as in a cassette tape recorder. The distance T between the inner surfaces of the main board 12 and the additional board 13 is made so as to receive not only the IC card A as shown in FIG. 1 but also the thicker RAM pack card G as shown in FIG. 2'. The additional board 13 has a leaf spring 16 mounted thereon with one end so that the free end normally abuts on the inner surface of the opposite main board 12. As shown in FIG. 6, which is a bottom plan view of the first board 10, said leaf spring 16 is preferably of bifurcated form to be fixed to the board 13 with the ends of the two leg portions so that the transverse bar portion connecting said two legs may stably urge the external storage card A or G against the main board 12. The additional board 13 also has a window 17 formed therein so that the contact points D of the IC card and J of the RAM pack card respectively correctly loaded in the pocket may just face said window 17.

The second board or base body 20 comprises a main board 22, a pair of side walls 23 (FIG. 3), a rear end wall 24 and a front end wall 25. On said second main board 22, there is mounted a block member 31 provided with contact pins 32 of the number and arrangement corresponding to that of the external storage cards A or G so that when the first board 10 is pivotally moved to be in the closed position relative to the second board 20 as shown in FIG. 3, the contact points D or J may respectively engage with said contact pins 32 protruding through said window 17, whereby informations stored in said external storage card A or G may be read by the computer and the necessary information taken out by means of the output printer or display of the computer via electric leads not shown, and necessary new informations may be written in said external storage card by actuating the input keys of the computer.

It is preferable to provide a spring means 18 at the hinged portion so as to normally keep the first board 10 at an angle, for instance of 60° in the open position relative to the second board 20. When manually pushing the first board 10 down against the force of said spring means 18 to be in the closed position, a latch pin 19 mounted on the additional board 13 at the front edge may engage with a hart latch member 39 provided on the concerned portion of the second board front wall 25 to lock the two boards in the closed position. Said latch member 39 is preferably arranged such that one pushing-down operation of the first board provides the engagement of the latch pin 19 with said latch member and another pushing-down operation provides the disengagement of the pin 19 from the latch member.

Now with reference to FIG. 4B which is a sectional view taken along the line IV—IV in FIG. 3, FIG. 5 which is a sectional view taken along the line V—V in FIG. 7 in an enlarged scale, and FIG. 7 which is a top plan view of the second board 20, the yieldingly movable block member 31 provided with the eight contact pins 32 will be explained in more detail. The arrangement ensures reliable engagement thereof with the contact points D or J of the external storage card held by the first board 10.

The block member 31 has a coiled spring 33 fixed at one end thereof on the bottom side thereof. The other end of the coiled spring 33 is fixed on the second main board 22 so that the member 31 may be yieldingly movable. Said block member 31 is further provided with a pair of arm pins 34 respectively fixed on the opposite sides thereof so as to protrude outwardly. The second board 22 has opposite upstanding side walls 26, 26 respectively formed with guide grooves 26', 26' so that said arm pins 34 are snugly engaged therewith for allowing the block member 31 to yieldingly move in the vertical direction as best shown in FIG. 5 and swing about said arm pins 34 as best shown in FIG. 4B. There is further provided an upstanding end wall 27 to connect said upstanding side walls 26 (FIG. 7) on the second board 22 for limiting excess swing of the block member 31.

Figure 5:
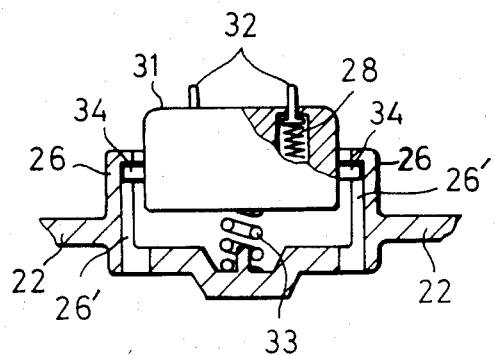
FIG. 5 is a sectional view of the contact pin block member and structure for supporting said block member taken along the line V—V in FIG. 7 in an enlarged scale.

As shown in FIG. 5, each of the contact pins 32 is provided in the block member 31 to be preferably yieldingly movable in its axial direction by providing a coiled spring 28.

Figure 4B:
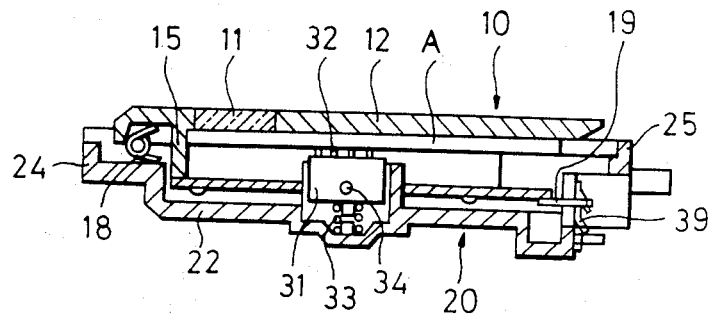
FIG. 4B is sectional view also taken along line IV—IV in FIG. 3 but showing said boards in the engaged position.

When the lid 10 which is loaded with the IC card A or RAM pack card G is pivotally moved from the open position in FIG. 4A to the closed position in FIG. 4B, the leftmost pins 32 (in said Figures) are firstly engaged with the external storage card A or G so that the block member 31 may tilt a little towards the left and sink down a little to comply with the pivotal movement of the first board 10, and finally the block member 31 takes the normal upstanding position so that all contact pins 32 may engage with the concerned contact points D or J. Even if the thin IC card A should be warped, independently yieldingly movable contact pins 32 may respectively engage with the contact points of the card so as to ensure reliable electrical connection.

The arrangement and structure of the boards for holding the external storage card and mounting the contact pin block member, of course, should not be restricted to the above embodiment.

Figure 8:
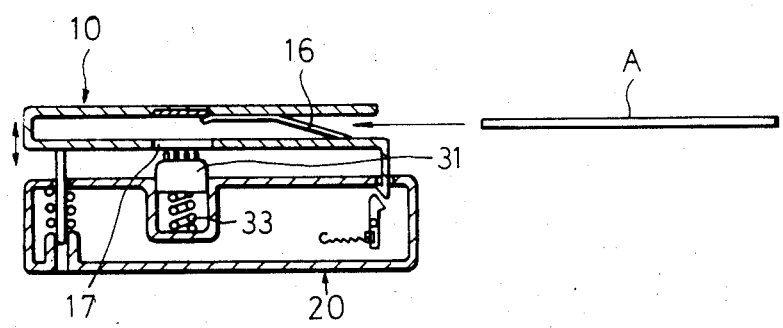
FIG. 8 is another embodiment of the invention.
Figure 9:
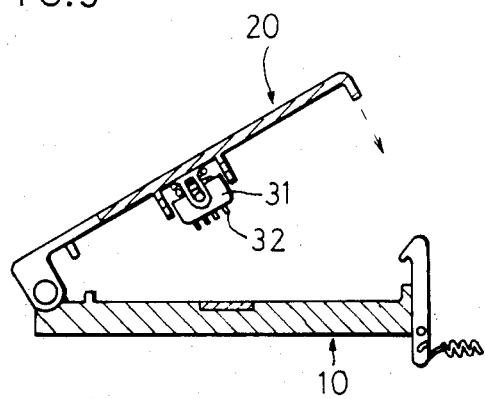
FIG. 9 is still other embodiment of the invention.

Various changes and modifications may be made. For instance, the lid or first board 10 for holding the storage card may not be pivoted with the base body or the second board 20 provided with the contact pin block member as illustrated above, but adapted to be yielding raised and lowered relative to the base body 20 as shown in FIG. 8. It is also possible to provide the first board 10 as the base body for holding the storage card, while the second board 20 is provided with the contact pin block member which is made pivotally movable relative to the former, as shown in FIG. 9.

Now with reference to FIGS. 7, 10A, 10B and 10C, the latter three Figures being sectional views taken along the line X—X in FIG. 7, means for correctly positioning the external storage card A or G in the pocket will be explained.

In FIG. 7 there are provided a pair of such means represented generally by 40, 40. The positioning means 40 is provided by cutting off the second main board 22 to form three thin slits 41 so that a sort of cantilever 42 surrounded thereby may be pivotally yieldable at the root portion where no slit is formed as best shown in FIG. 10A. In order to make such movement, a groove 43 is preferably formed in the reverse side of said board 22 at said root portion. At the free end of said cantilever 42, there is provided an upwardly protruding flange 44. The top portion thereof is trimmed off to form an inwardly slanting wall 44a.

As shown in FIG. 10A, if the external storage such as the IC card A which is loaded in the pocket of the lid while urging the leaf spring 16 down, is not sufficiently inserted, the trailing edge of the card abuts on the top of said upstanding flange 44 so that the lid can not be brought in the closed position relative to the base body 20. In this case the operator must push the card A further forward until the leading edge thereof abuts the end wall 15.

Even if the card A is not sufficiently held by the first main board 12 despite said further forwarding operation, owing to the inwardly slanting portion 44a, the card A is shifted back to the left just before the first board 12 is completely engaged with the second board 22 as shown in FIG. 10C. Recesses 45 are provided for receiving the top portion of the upstanding flange 44 from being engaged with the first board 12 when the latter reaches the completely closed position shown in FIG. 10C.

In FIG. 7 there is preferably provided a limit switch 46 so that when the lid 10 is completely engaged with the base body 20 said switch is closed to make the computer ready for reading out of the loaded external storage card and writing therein.

With reference to FIGS. 11A, 11B and 11C, a porous elastomer pad 35 is embedded in the first main board 12 so that when said board without holding any external storage card is pivotally moved in the closed position relative to the second main board 22 said pad 35 may engage with the contact pins 32 provided in the block member 31 and protruding through the window 17 (FIG. 4A).

As seen in FIG. 11A, the pad 35 is firstly engaged with the leftmost pins 32 as the first board 12 is pivotally moved down. When the board 12 is further moved down, the block member 31 is inclined a little (FIG. 11B) so that the engagement of the pad 35 with the contact pins 32 is extended toward the right, and finally all contact pins 32 are engaged with the pad 35 as shown in FIG. 11C.

As appreciated from the above, the contact pins 32 are wiped or brushed with porous elastomer pad 35 to be made clean, whereby possible trouble caused by stained contact points 32 may be avoided.

Figure 12:
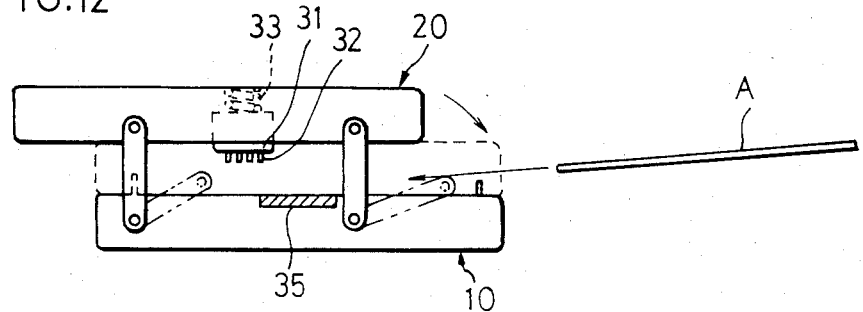
FIG. 12 is a sectional view of still another arrangement of the two opposite boards one for holding the external storage card while the other is provided with the contact pin block member.

Such pad may be provided also in the devices illustrated in FIGS. 8 and 9. It is applied also to the device as shown in FIG. 12.

According to another aspect of the invention, a portable computer in which the compact device adapted to easily read and write not only an IC card but also a RAM pack in card plate form as illustrated above is incorporated, whereby considerably extended jobs may readily be done at the site.

Figure 13:
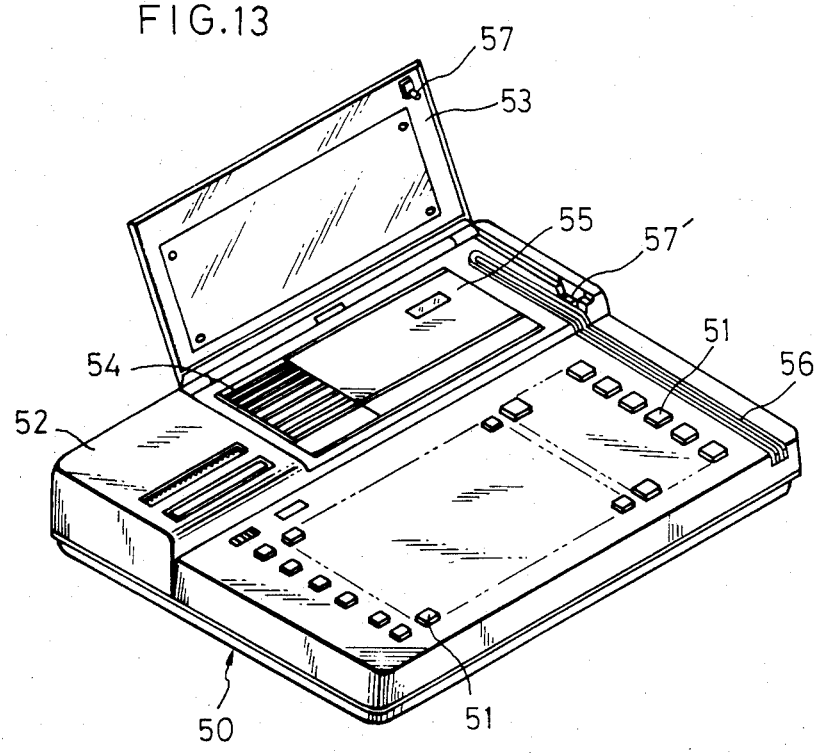
FIG. 13 is a perspective view showing a portable computer in which the device illustrated above is incorporated.

One embodiment of such portable computer is shown in FIG. 13 in which a casing 50 contains a CPU, internal storages and various elements necessary for the computer therein. If further comprises input keys 51, printer 52, pivotally movable display panel 53, alarm speaker 54 and IC memory reading and writing device 55 illustrated above. Groove 56 is for reading magnetic cards.

Figure 14:
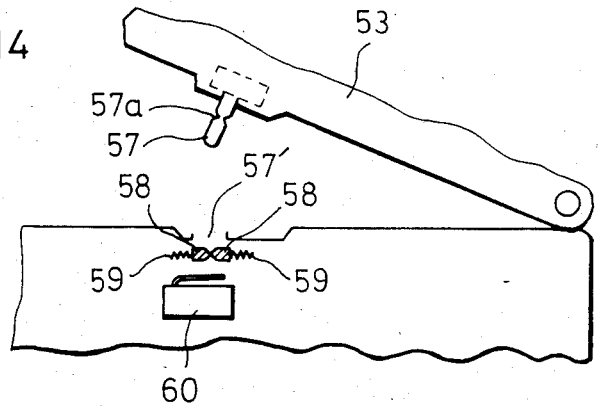
FIG. 14 is a sketch showing an image control knob for the pivotally movable display panel illustrated in FIG. 13 which is utilized as locking means therefor and as an actuator for the limit switch.

On the panel 53 there is provided an image control knob 57. In order to make the computer compact, said knob is preferably utilized for locking said display panel 53 in the closed position and as an actuator for the limit switch. With reference to FIG. 14, the knob 57 is formed with a peripheral groove 57a and there is provided a hole 57' formed in the housing wall so that said knob 57 may pass through said hole 57' when the panel 53 is pivotally moved down to the closed position. Beneath said hole 57', there are arranged a pair of semicircle members 58, 58 normally in the contact position urged by spring means 59, 59 as illustrated so that when the display panel 53 is pivotally moved downward, said knob 57 separates said two members 59 against the spring force to be engaged therewith around the peripheral groove 57a for locking. It is preferable to provide a limit switch 60 beneath said members 58 so that the free end of said knob 57 abuts on the switch 60 in said locking position for bringing the computer into the inoperative condition but when the display panel 53 is pivotally moved upward the concerned circuit is closed to bring the computer into the operative condition.

What is claimed is:

1. Device to be coupled with a computer for reading and writing IC external storage in the form of a card having a plurality of contact points arranged on a portion of the card comprising:

a first board having a main board and an additional board which are arranged to receive and hold the card therebetween, a second board hingedly connected to the first board so that the first board is pivotally movable between a first position wherein the first board is engaged with the second board and a second position wherein the first board is opened with respect to the second board so that the storage card may freely be loaded on and removed from the first board.

a block member provided with contact pins of the number and arrangement corresponding to that of said contact points, mounting means mounting said block member on said second board, said mounting means comprising springs so as to normally maintain said block member in an extended position while being yieldable movable from said extended position, said additional board having a window formed therein through which the contact pins on the block member pass so as to contact with the contact points of the loaded storage card when the first board is brought into the first position.

2. Device as claimed in claim 1, wherein the additional board has a spring means fixed thereon which urges the loaded storage card against the main board.

3. Device as claimed in claim 1 further comprising spring means for each of the contact pins in the block member such that the contact pins are each yieldingly movable in their axial direction.

4. Device as claimed in claim 1, wherein said first board and said second board each have a front end and an opposite rear end, pivot means pivotally connecting the rear ends of said first and second boards, said block member being provided with a pair of transverse protruding arms, said second board having an upstanding flange having grooves, said arms being received in said grooves to thereby allow the block member to yieldingly tilt substantially towards said rear end of the second board in the initial stage of contact of the loaded storage card with the contact pins of the block member.

5. Device as claimed in claim 1, wherein said first board and said second board have a front end and an opposite rear end, pivot means pivotably connecting the rear ends of said first and second boards, said second board having an upstanding flange at the front end thereof, a top portion of the flange having a slanted surface which acts on an edge of an insufficiently loaded storage card so as to move the card to the correct position when the first board is moved towards the first position.

6. Device as claimed in claim 1, wherein the main board has a pad of porous elastomer embedded therein so that when said first board without holding any storage card is brought to the first position, the contact pins of the yieldingly movable block member are rubbed by said pad to thereby clean the contact pins.

7. Device as claimed in claim 1, wherein the main board has a window for confirming whether or not the storage card is correctly positioned and identifying the loaded storage card.

8. Device as claimed in claim 1 further comprising a limit switch mounted on one of said first and second boards and which is closed when the first board is in said first position engaged with the second board so as to make the computer ready for reading out the loaded storage card and writing therein.

* * * * *